(12) United States Patent
Griswold et al.

(10) Patent No.: US 8,169,221 B2
(45) Date of Patent: May 1, 2012

(54) MULTI-FREQUENCY EXCITATION COILS FOR MRI

(76) Inventors: Mark A. Griswold, Shaker Heights, OH (US); Jeremiah A. Heilman, Shaker Heights, OH (US); Franz Schmitt, Erlangen (DE)

( * ) Notice: Subject to any disclaimer, the term of this patent is extended or adjusted under 35 U.S.C. 154(b) by 361 days.

(21) Appl. No.: 12/290,419

(22) Filed: Oct. 30, 2008

(65) Prior Publication Data
US 2009/0134876 A1 May 28, 2009

Related U.S. Application Data

(60) Provisional application No. 61/001,235, filed on Oct. 31, 2007.

(51) Int. Cl.
*G01V 3/00* (2006.01)
(52) U.S. Cl. .................. 324/322; 324/318; 324/307
(58) Field of Classification Search .......... 324/300–322; 600/410, 411, 422; 382/128–131
See application file for complete search history.

(56) References Cited

U.S. PATENT DOCUMENTS

| | | | | |
|---|---|---|---|---|
| 5,602,479 A * | 2/1997 | Srinivasan et al. | ............ | 324/318 |
| 6,081,120 A * | 6/2000 | Shen | ............ | 324/318 |
| 6,133,735 A * | 10/2000 | Hurlimann et al. | ............ | 324/303 |
| 6,822,454 B2 * | 11/2004 | Peck et al. | ............ | 324/321 |
| 7,081,753 B2 * | 7/2006 | Mullen et al. | ............ | 324/318 |
| 7,132,829 B2 * | 11/2006 | Hudson et al. | ............ | 324/318 |
| 7,183,770 B2 * | 2/2007 | Graβlin et al. | ............ | 324/318 |
| 7,271,592 B1 * | 9/2007 | Gerald et al. | ............ | 324/318 |
| 7,777,493 B2 * | 8/2010 | Desvaux et al. | ............ | 324/322 |
| 2006/0017438 A1 * | 1/2006 | Mullen et al. | ............ | 324/318 |
| 2006/0054810 A1 * | 3/2006 | Grasslin et al. | ............ | 250/299 |
| 2009/0134876 A1 * | 5/2009 | Griswold et al. | ............ | 324/318 |
| 2009/0140738 A1 * | 6/2009 | Desvaux et al. | ............ | 324/313 |
| 2009/0278537 A1 * | 11/2009 | Harvey | ............ | 324/318 |

* cited by examiner

*Primary Examiner* — Brij B Shrivastav
*Assistant Examiner* — Tiffany Fetzner
(74) *Attorney, Agent, or Firm* — J T Kalnay

(57) ABSTRACT

Devices, systems, methods, and other embodiments associated with magnetic resonance imaging (MRI) are described. In one embodiment, an apparatus includes an RF coil for use in multi-nuclear excitation in magnetic resonance imaging (MRI). The RF coil includes a set of two or more L-C coils. Members of the set of two or more L-C coils have individual resonance frequencies. An RF amplifier is placed near the RF coil. The RF amplifier is controllable to selectively produce the individual resonance frequency of a member of the set of two or more L-C coils based, at least in part, on a digital input provided to the RF amplifier.

32 Claims, 15 Drawing Sheets

MULTI-FREQUENCY EXCITATION COILS FOR MRI

CROSS REFERENCE TO RELATED APPLICATIONS

This application claims the benefit of U.S. provisional application Ser. No. 61/001,235 filed on Oct. 31, 2007, by the same inventors.

COPYRIGHT NOTICE

A portion of the disclosure of this patent document contains material subject to copyright protection. The copyright owner has no objection to the facsimile reproduction of the patent document or the patent disclosure as it appears in the Patent and Trademark Office patent file or records, but otherwise reserves all copyright rights whatsoever.

BACKGROUND

Magnetic resonance imaging (MRI) involves the transmission of radio frequency (RF) energy. RF energy may be transmitted by a coil. Resulting magnetic resonance (MR) signals may also be received by a coil. In early MRI, RF energy may have been transmitted from a single coil and resulting MR signals received by a single coil. Later, multiple receivers may have been used in parallel acquisition techniques. Using multiple receivers facilitates speeding up signal reception, which in turn may reduce scan time. Similarly, multiple transmitters may be used in parallel transmission techniques. Using multiple transmitters may facilitate speeding up a transmission process, which in turn may facilitate volumetric excitation, selective isolation, and other high speed features.

However, conventional parallel transmission techniques have encountered issues with scaling, fidelity, and synchronization. Additionally, conventional transmission techniques that attempt to excite multiple frequencies have experienced setup and tuning issues associated with interactions between multiple coils used to excite multiple frequencies. For example, tuning a first coil to excite a first frequency may cause a second, previously tuned coil to behave differently than the coil would otherwise. Thus, experiments employing multi-frequency excitation may have been performed infrequently.

Conventional systems may have attempted to parallelize their existing RF transmitters. Thus, conventional systems may have relied on multiple, individually powered, single channel, analog-in-analog-out RF transmitters for parallel transmission. These systems tended not to scale well due to cabling duplication, power transmitter duplication, control duplication, and other issues. Even when a small number (e.g., 4) of transmitters were employed, these systems may not have produced a desired fidelity. For example, conventional systems may have had complicated power distribution management and may have been difficult to synchronize. Additionally, conventional systems typically had poor isolation between coils, resulting in degraded performance. Furthermore, these systems may have required each element in an array to be tuned and matched. Tuning and matching each element is a very time-consuming procedure.

Conventional systems may also have been limited by their use of relatively low power (e.g., <50 W), low efficiency class A or class AB amplifiers. While some systems may have included on-coil series and/or shunt-fed class-D amplifiers, even these conventional systems have suffered from several limitations including inadequate detuning and low efficiency.

Due, at least in part, to these limitations, conventional systems may not have produced desired levels of amplitude and/or phase control and thus may have had less than desirable fidelity. Once again this may have limited the frequency with which multi-frequency experimentation may have been attempted.

BRIEF DESCRIPTION OF THE DRAWINGS

The accompanying drawings, which are incorporated in and constitute a part of the specification, illustrate various example systems, methods, and other embodiments of various aspects of the invention. It will be appreciated that the illustrated element boundaries (e.g., boxes, groups of boxes, or other shapes) in the figures represent one example of the boundaries. One of ordinary skill in the art will appreciate that in some embodiments one element may be designed as multiple elements, multiple elements may be designed as one element, an element shown as an internal component of another element may be implemented as an external component and vice versa, and so on. Furthermore, elements may not be drawn to scale.

DETAILED DESCRIPTION

Described herein are example systems, methods, and other embodiments associated with multi-nuclear excitation in MRI. In one embodiment, an apparatus includes a radio frequency (RF) coil. The RF coil includes an amplifier. The amplifier may be a current mode class D amplifier. The RF coil includes an L-C coil. The L-C coil includes an inductor and a capacitor. The L-C coil has a resonance frequency. The L-C coil may generate the resonance frequency or filter the resonance frequency. In one embodiment, the RF coil includes more than one L-C coil with different resonance frequencies. The RF coil may receive a digital signal. In one embodiment, the RF coil, the L-C coil, and the amplifier may be controlled with digital logic. The distance between the coil and the amplifier distinguishes example systems from conventional systems. In one example, the distance between the coil and the amplifier is less than one meter. In another example, the distance between the coil and the amplifier is less than 1 centimeter. In another example, the distance between the coil and the amplifier is less than one wavelength of the RF waveform produced by the apparatus.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Logic", as used herein, includes but is not limited to hardware, firmware, and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and so on. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

Figure 1:
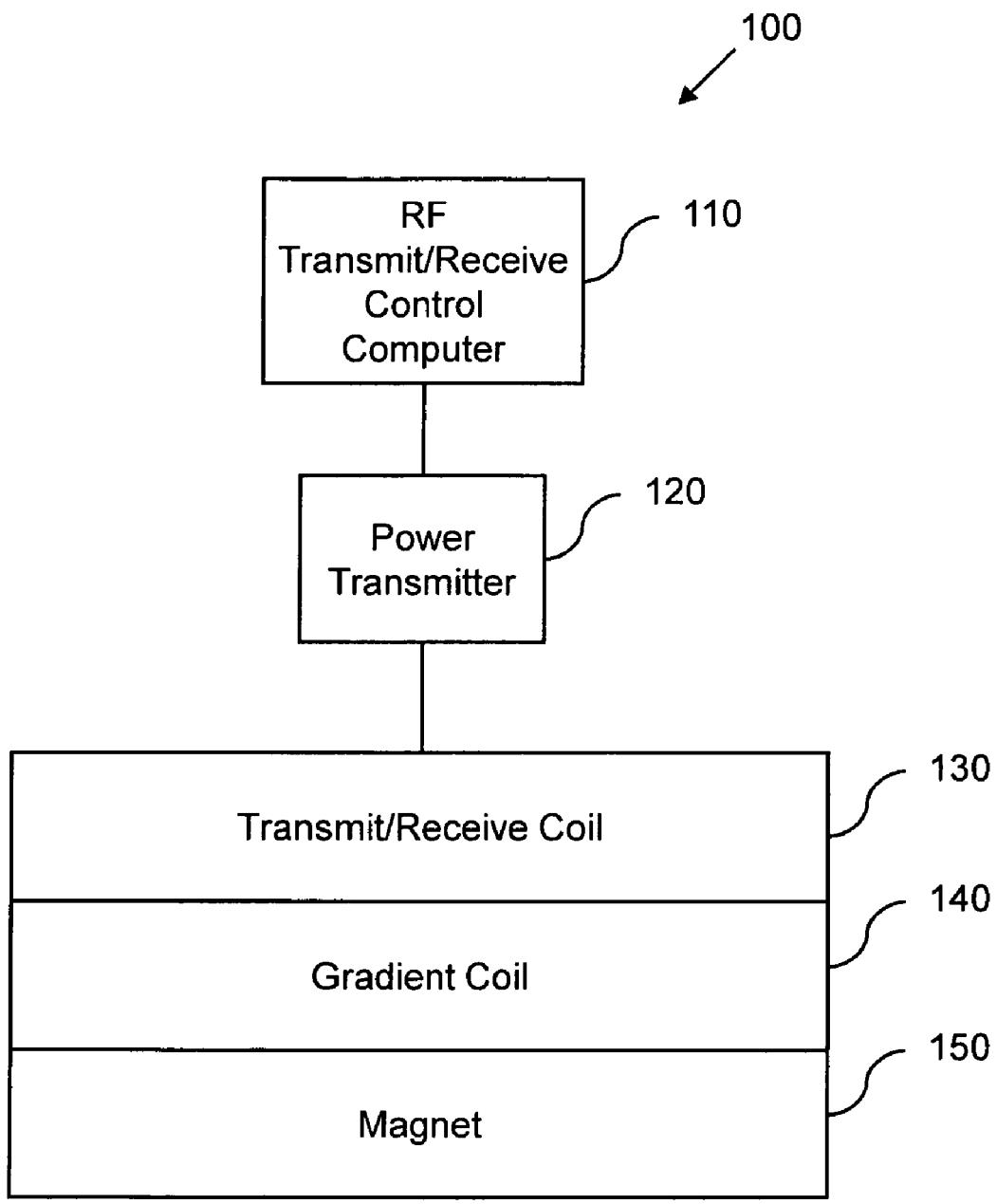
FIG. 1 illustrates one embodiment of portions of a conventional MRI system.

FIG. 1 illustrates a conventional MRI system 100. The MRI system 100 includes an RF transmit/receive control computer 110, a power transmitter 120, a transmit/receive coil 130, a gradient coil 140, and a magnet 150. The transmit/receive coil 130 may be a single transmit coil and a single receive coil. This conventional MRI system 100 could not perform parallel acquisition or transmission.

The conventional MRI system 100 presented the transmit coil 130 with an analog signal and the transmit coil 130 produced an analog signal. The analog signal was typically of a single frequency. The transmit coil 130 was powered by a single power transmitter 120 that may have been controlled by a computer 110. The conventional MRI system 100 would also have included other standard MRI apparatus components.

Figure 2:
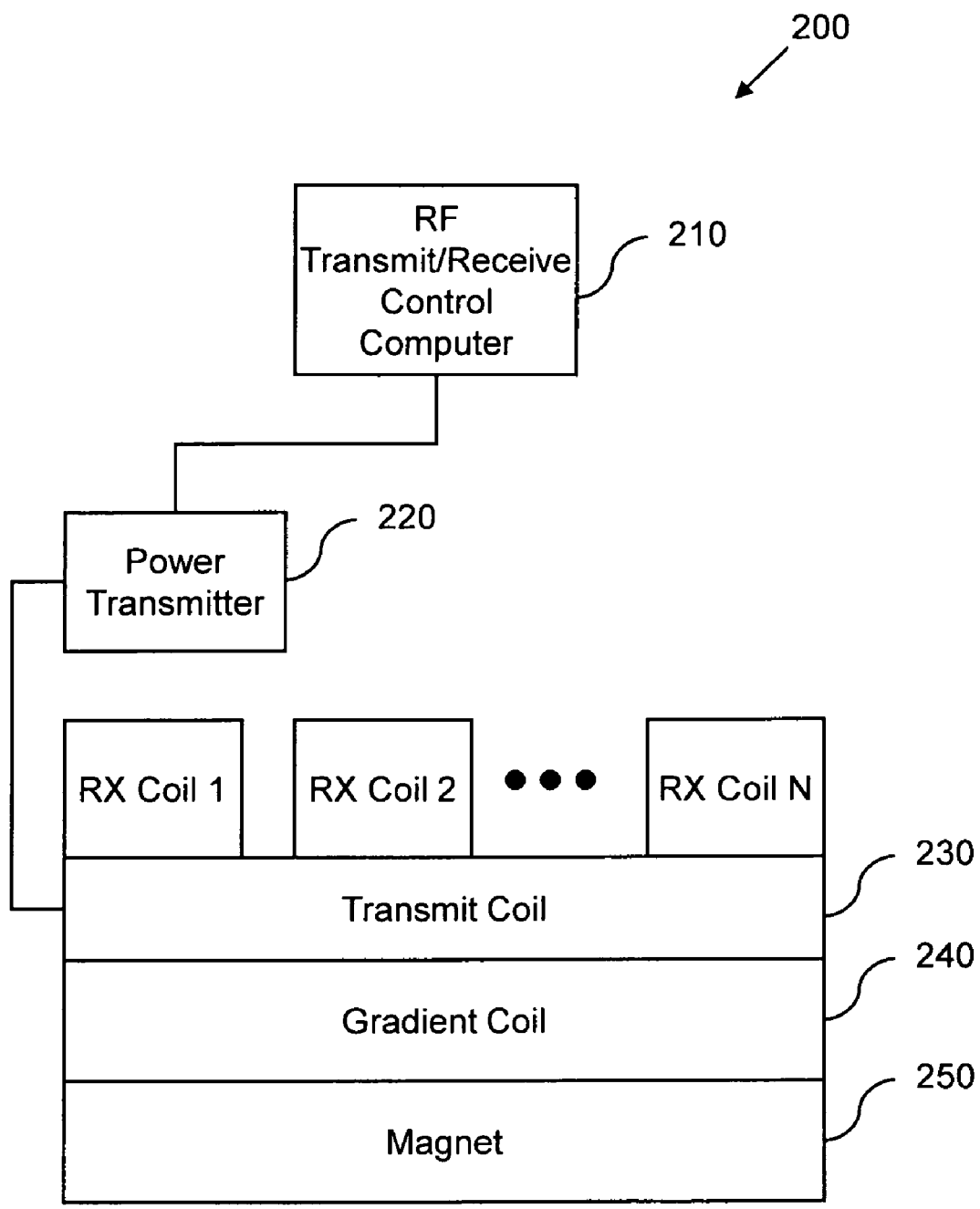
FIG. 2 illustrates one embodiment of portions of a conventional MRI system.

FIG. 2 illustrates another conventional MRI system 200. The conventional MRI system 200 includes an RF transmit/receive control computer 210, a power transmitter 220, multiple receive (RX) coils 1-N, a single transmit coil 230, a gradient coil 240, and a magnet 250. This conventional MRI system 200 could perform parallel acquisition but could not perform parallel transmission. This conventional MRI system 200 presented the transmit coil 230 with an analog signal and the transmit coil 230 produced an analog signal. The power transmitter 220 supplied power to the transmit coil 230. The power transmitter 220 was connected to the transmitter coil 230 with a cable and to the RF transmit/receive control computer 210 with a cable. Once again the analog signal typically had a single frequency. The transmit coil 230 was powered by a single transmitter 220 that may have been controlled by a computer. Once again the MRI system 200 would also have included other standard components.

Figure 3:
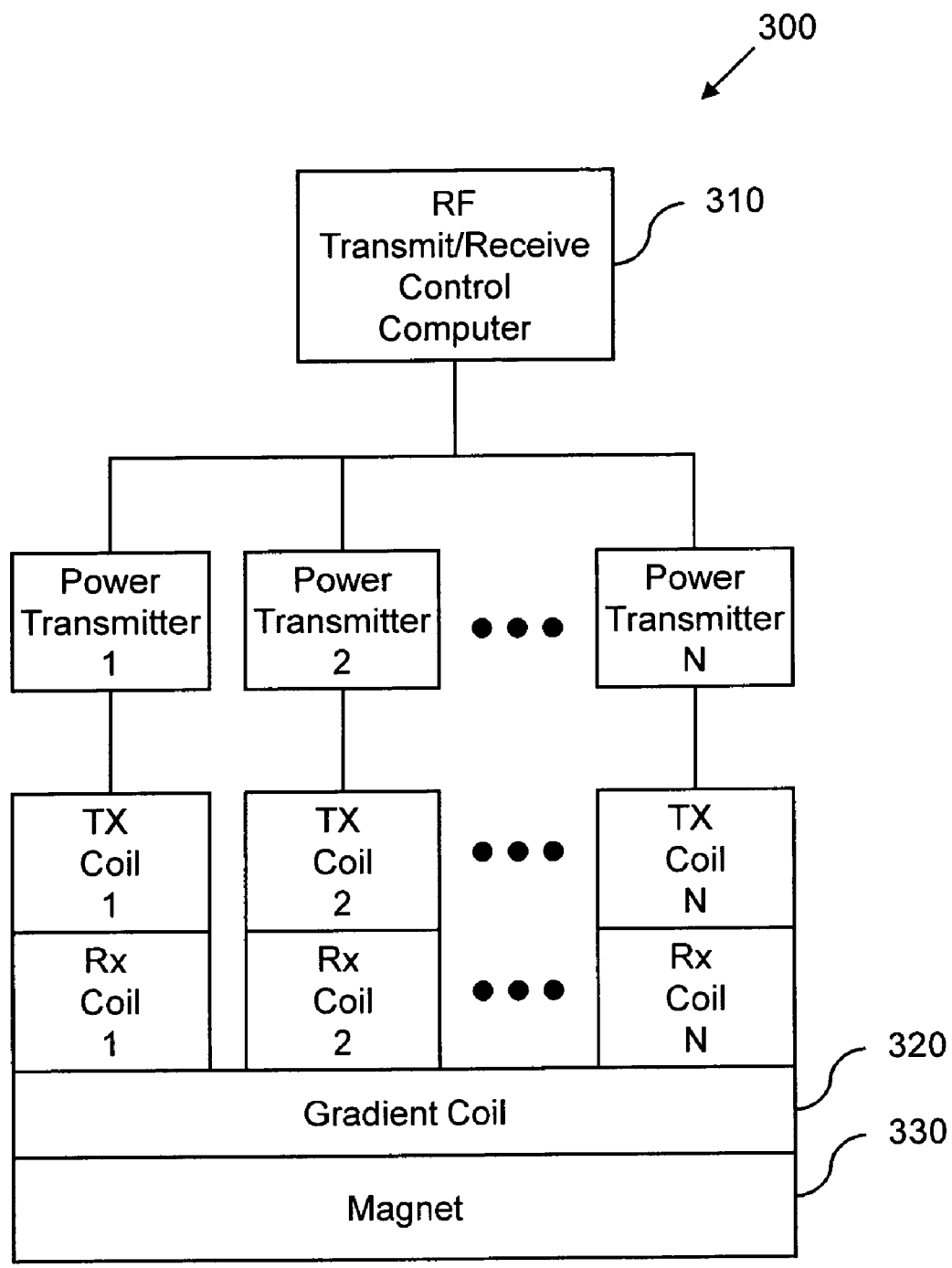
FIG. 3 illustrates one embodiment of portions of a conventional MRI system.

FIG. 3 illustrates another conventional MRI system 300. The conventional MRI system 300 includes an RF transmit/receive control computer 310, power transmitters 1-N, multiple receive (RX) coils 1-N, multiple transmit (TX) coils 1-N, a gradient coil 320, and a magnet 330. This conventional MRI system 300 could perform both parallel acquisition and parallel transmission. However, this conventional MRI system 300 may have suffered from the limitations described above (e.g., scaling, synchronization, interference between coils, . . . ).

The conventional MRI system 300 presented each transmit coil 1-N with an analog signal and each transmit coil 1-N produced an analog signal. While multiple analog signals were produced, the goal was typically to produce multiple signals having the same frequency. Each transmit coil 1-N was powered by a separate power transmitter 1-N and was connected to a power transmitter 1-N by a separate coaxial cable. Thus, the conventional MRI system 300 illustrated in FIG. 3 did not scale well due to power transmitter proliferation, tuning and matching requirements, cable proliferation and coupling, and power consumption increases. The sheer volume of the multiple power transmitters 1-N and multiple cables made physical design difficult. The power required to drive the TX coils 1-N and the resulting heat produced by all these power transmitters 1-N created additional design issues. Furthermore, cable paths and coil design may have produced cross talk issues, interference issues, and so on. Furthermore, synchronization of the TX coils 1-N was difficult, if possible, to achieve, and even included cable length and connection engineering issues.

Figure 4:
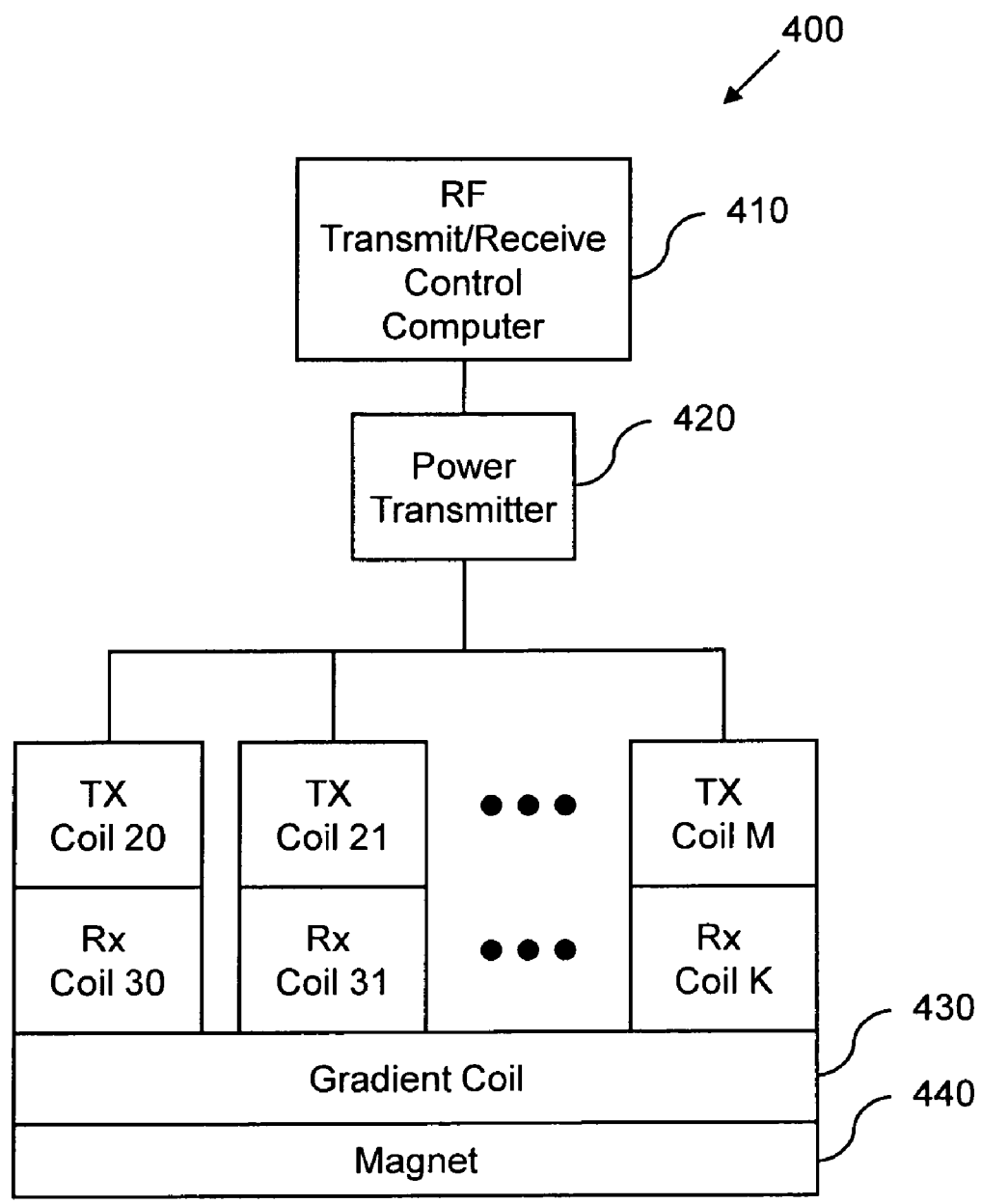
FIG. 4 illustrates one embodiment of portions of a parallel MRI system with an on-coil switched mode amplifier.

FIG. 4 illustrates an MRI system 400. The system 400 includes an RF transmit/receive control computer 410, a power transmitter 420, multiple receive (RX) coils 20-M, multiple transmit (TX) coils 30-K, a gradient coil 430, and a magnet 440. The transmit coils 20-M have on-coil switched mode amplifiers that improve parallel transmission in the MRI system 400.

The transmit coils 20-M may be powered by one or more digital controllers that are controlled by a computer 410. The transmit coils 20-M may be connected to the digital controllers by a dedicated connection (e.g., copper cable, fiber optic cable, wireless connection). The dedicated connection improves synchronization of the transmit coils 20-M over conventional systems. Using a connection other than copper cable may facilitate mitigating interference issues, cross talk issues, physical space requirement issues (e.g., cable space, transmitter space), and so on. Using a single digital controller may also reduce issues associated with physical layout, synchronization, heating, and cooling of the MRI system 400.

The electronic components (e.g., FETs) in the on-coil switched-mode amplifier facilitate controlling the transmit coils 20-M with a digital signal. Thus, the transmit coils 20-M may receive a digital signal and produce an analog signal having improved characteristics. Typically, the analog signals would have substantially the same frequency. The MRI system 400 would include other standard MRI elements.

Figure 5:
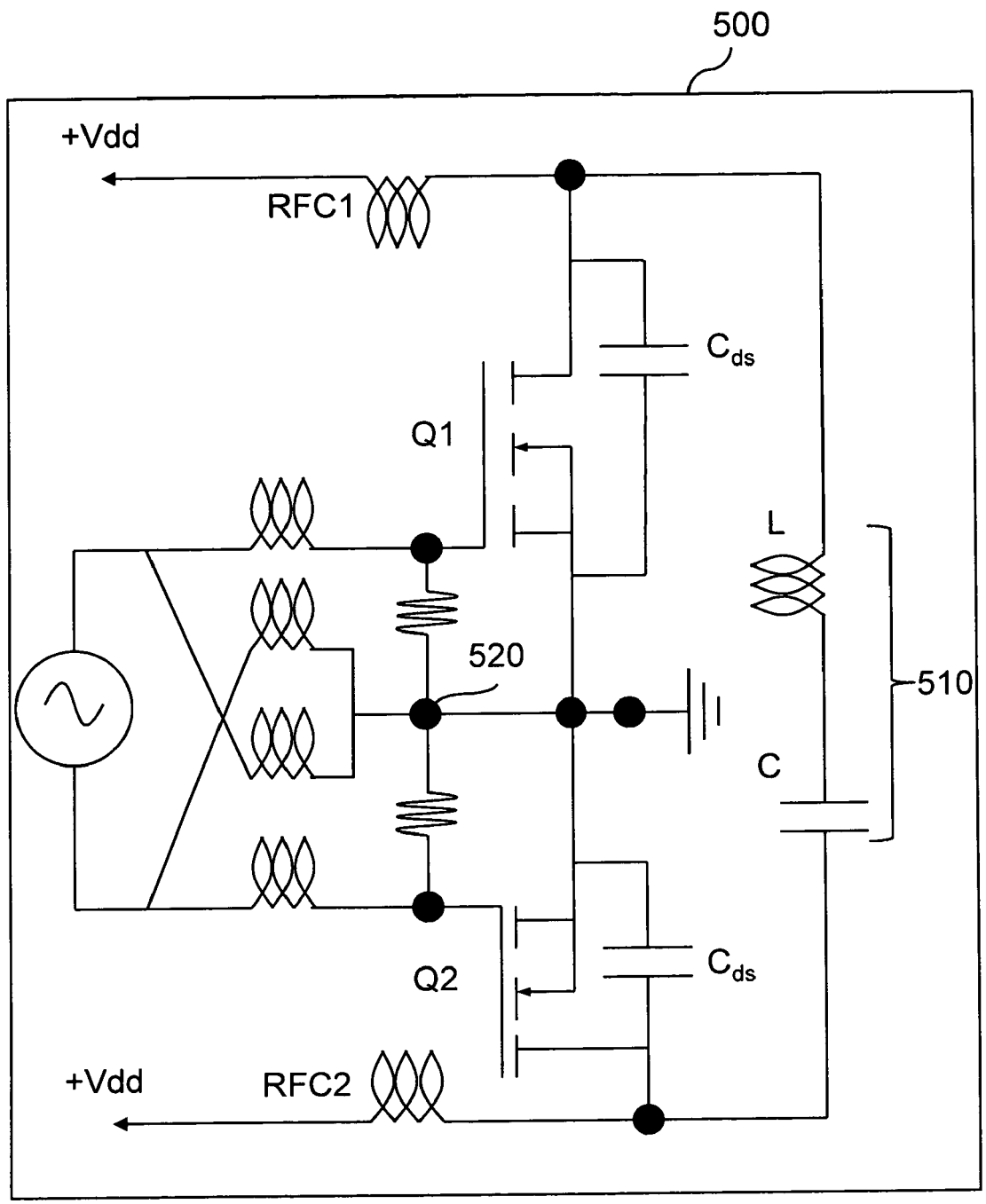
FIG. 5 illustrates one embodiment of an apparatus with a current-mode class-D amplifier topology for use in parallel MRI transmission involving on-coil switched-mode amplification.

FIG. 5 illustrates an example apparatus 500. The apparatus 500 may include a current-mode class-D (CMCD) amplifier topology. The apparatus 500 shown with this topology may be referred to as an L-C-switched-mode coil. In the illustration, a coil 510 is represented by the series L-C leg. The L refers to inductance in the coil 510 and the C refers to capacitance in the coil 510. The coil 510 may be a surface coil. Two radio frequency chokes RFC1, RFC2 are connected to the coil 510. The two radio frequency chokes RFC1, RFC2 act as current sources. Drain-source capacitances $C_{ds}$ are in series with the coil 510. Alternative shunting of an applied DC voltage to ground as a field effect transistor (FET) Q1 or Q2 is driven to saturation produces excitation at desired RF frequencies. Typically, a single RF frequency would be produced.

This CMCD design may be implemented on an array of surface coils of various sizes (e.g., 8.5 cm×8.5 cm). The coils may include various shielding configurations (e.g., 12.5 cm×12.5 cm). The coils may be tuned to different field strengths (e.g., 1.5 T). Note that the coil terminals 520 are attached between the drains of the two FETs Q1, Q2 and tuned so that the circuit is series resonant when one of the FETs Q1, Q2 is switched on. In one example, both FETs Q1, Q2 may be driven out of phase to optimize efficiency. While two FETs are illustrated, it is to be appreciated that two or more FETs Q1, Q2 may be employed.

In one example, pulsed power outputs up to 1200 W may be produced using the topology illustrated in FIG. 5. These outputs may be produced with amplifier efficiencies in the 85% range. In one example, upper harmonic suppression greater than 40 dB may be achieved. Isolation between adjacent, non-overlapping coils may be achieved. In one example, isolation of 20 dB due to coil detuning in the off state was achieved. Furthermore, 6 dB of isolation between adjacent, non-overlapping resonant coils was achieved.

The apparatus 500 illustrated in FIG. 5 improves on conventional apparatuses by using a high-power amplifier topology for parallel transmission using on-coil field effect transistors (FETs) Q1, Q2 that can be driven by low power (e.g., 5V) signals. The apparatus 500 illustrated in FIG. 5 uses a current-mode class-D (CMDC) amplifier topology. CMCD amplifiers may produce higher efficiency at higher output power than class-D or class-E amplifiers. The higher efficiency at higher output power is related to the series incorporation of FET drain source capacitance $C_{ds}$ in the coil 510 loop, which facilitates zero voltage switching. The coil transmit current may be uniquely controlled by the gate voltage. Since the load may be driven directly by the amplifier (e.g., does not require tuning and matching to a 50 ohm network), the amplifier is referred to as a "current mode" amplifier. Since the current in the coil 510 is uniquely determined by the gate voltage, this suppresses coupled currents from other coils.

The symmetry of the configuration additionally suppresses the effects of coupled currents. When both FETs Q1, Q2 are off, the coil 510 is automatically detuned. The coil 510 is detuned because both $C_{ds}$ are in series with the coil 510. In one example, concentric shielding can be used to reduce electric field coupling. This facilitates reducing drain bias disturbances. These two factors combine to improve isolation over conventional approaches.

Figure 6:
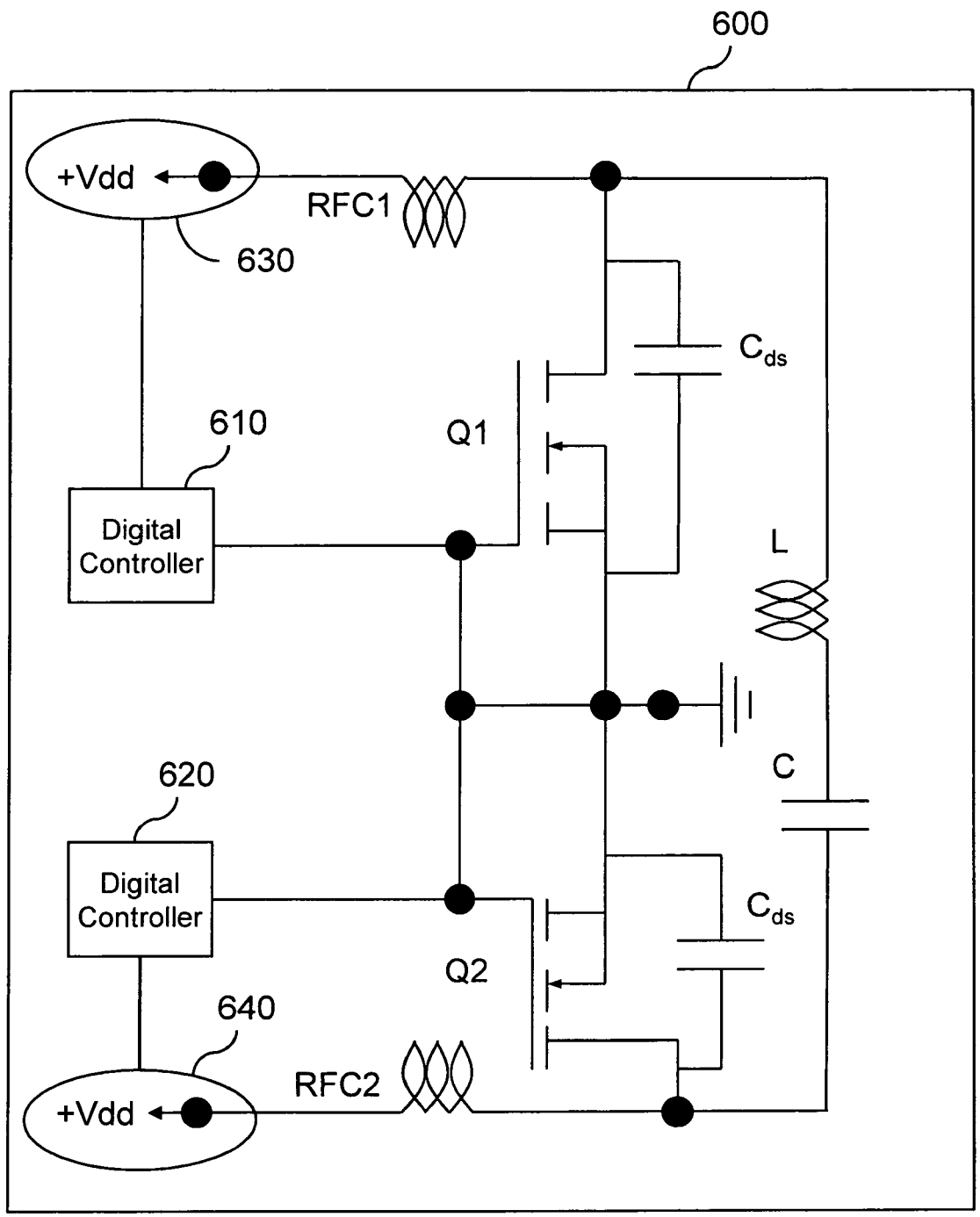
FIG. 6 illustrates one embodiment of an apparatus with a current-mode class-D amplifier topology for use in parallel MRI transmission involving on-coil switched-mode amplification in which voltage and/or current sources are additionally and/or alternatively digitally controllable.
Figure 7:
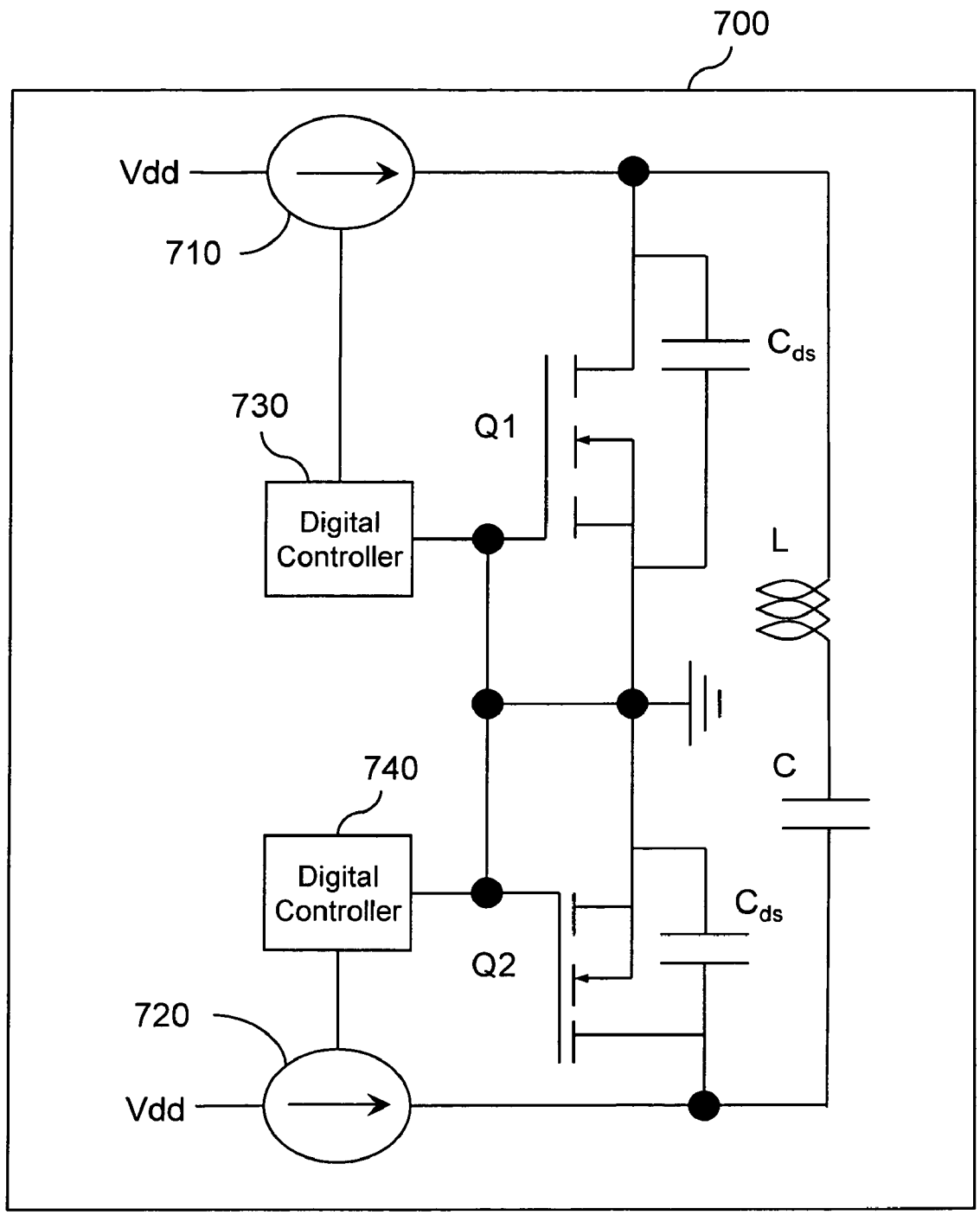
FIG. 7 illustrates one embodiment of an apparatus with a current-mode class-D amplifier topology for use in parallel MRI transmission involving on-coil switched-mode amplification in which current sources are additionally and/or alternatively digitally controllable.
Figure 8:
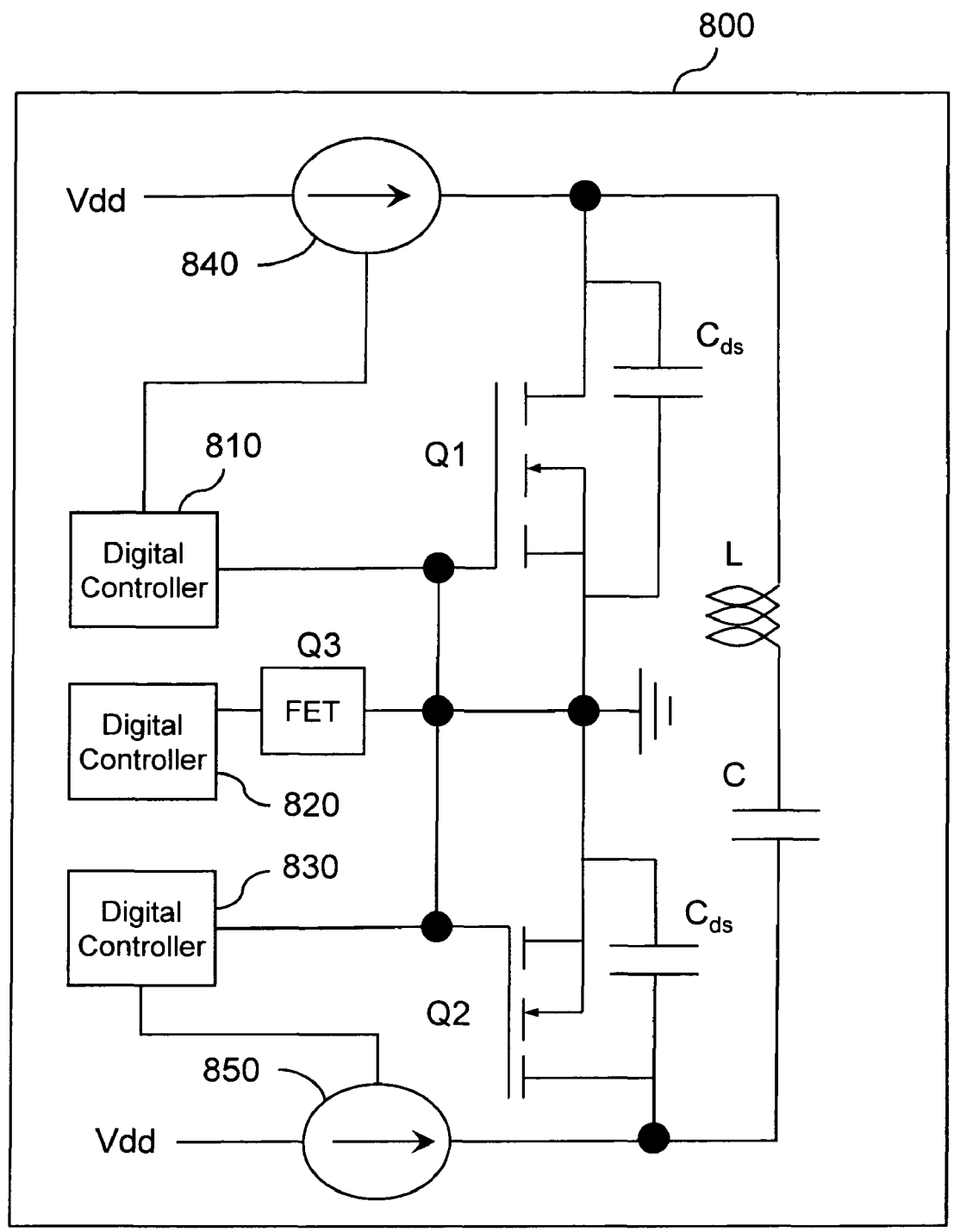
FIG. 8 illustrates one embodiment of an apparatus with a current-mode class-D amplifier topology for use in parallel MRI transmission involving on-coil switched-mode amplification in which an additional FET has been added.

It is to be appreciated that FIG. 5 illustrates one example apparatus 500 with a topology for parallel transmission in MRI. FIGS. 6, 7, and 8 illustrate more generic aspects of different examples of an apparatus with parallel transmission topologies. FIGS. 6, 7, and 8 illustrate an MRI apparatus with additional and/or alternative digital control of current sources and/or supplies. For example, FIG. 6 illustrates an apparatus 600 with a topology in which voltage sources and/or current sources are additionally and/or alternatively digitally controllable with digital controllers 610, 620. In addition, FIG. 6 illustrates digital control of the +Vdd voltages 630, 640 and the radio frequency chokes RFC1, RFC2 by the digital controllers 610, 620. This digital control facilitates improving amplitude modulation accuracy and ease of use.

FIG. 7 illustrates an embodiment of an apparatus 700 with a topology for parallel transmission in MRI. FIG. 7 illustrates an apparatus 700 with a topology in which current sources 710, 720 are additionally and/or alternatively digitally controllable. Digital controllers 730, 740 may digitally control the current sources 710, 720. Note that the +Vdd voltages 630, 640 (FIG. 6) and the radio frequency chokes RFC1, RFC2 (FIG. 6) have been replaced with more generic current sources, which may also be digitally controlled. Once again this digital control facilitates improving amplitude modulation accuracy and ease of use.

FIG. 8 illustrates an embodiment of an apparatus 800 with a topology for parallel transmission in MRI. FIG. 8 illustrates a topology in which an additional FET Q3 has been added. FET Q3 has been illustrated using a labeled box rather than a conventional circuit drawing element. This is to point out that "FET", as used herein, is used as a generic term and may refer to a class of switching elements that may include, for example, FETs, bipolar junction transistors (BJTs), metallic-oxide-semiconductor (MOS) transistors, complementary MOS (CMOS) transistors, metal-oxide-semiconductor field-effect transistors (MOSFETs), junction field effect (JFET) transistors, silicon on insulator, (SOI) transistors, and so on. Thus, in different embodiments of the apparatus 800 and circuits described herein, different switching elements may be employed.

The apparatus 800 includes digital controllers 810, 820, 830. The digital controllers 810, 820, 830 are shown in FIG. 8 as three separate controllers, however, in some embodiments the digital controllers 810, 820, 830 may be implemented in a single controller. The digital controller 810 may control a current source 840 and/or a transistor Q1. The digital controller 820 may control the FET Q3. The digital controller 830 may control a current source 850 and/or a transistor Q2.

Note that all of the topologies illustrated in FIGS. 5-8 include a single L-C coil. In other embodiments, more than one L-C coil may be implemented. Different L-C coils may be parallel to each other or in other configurations. The different L-C coils may have different resonant frequencies and may be digitally controlled by a digital controller. The L-C coils may be software configurable in some embodiments.

Figure 9:
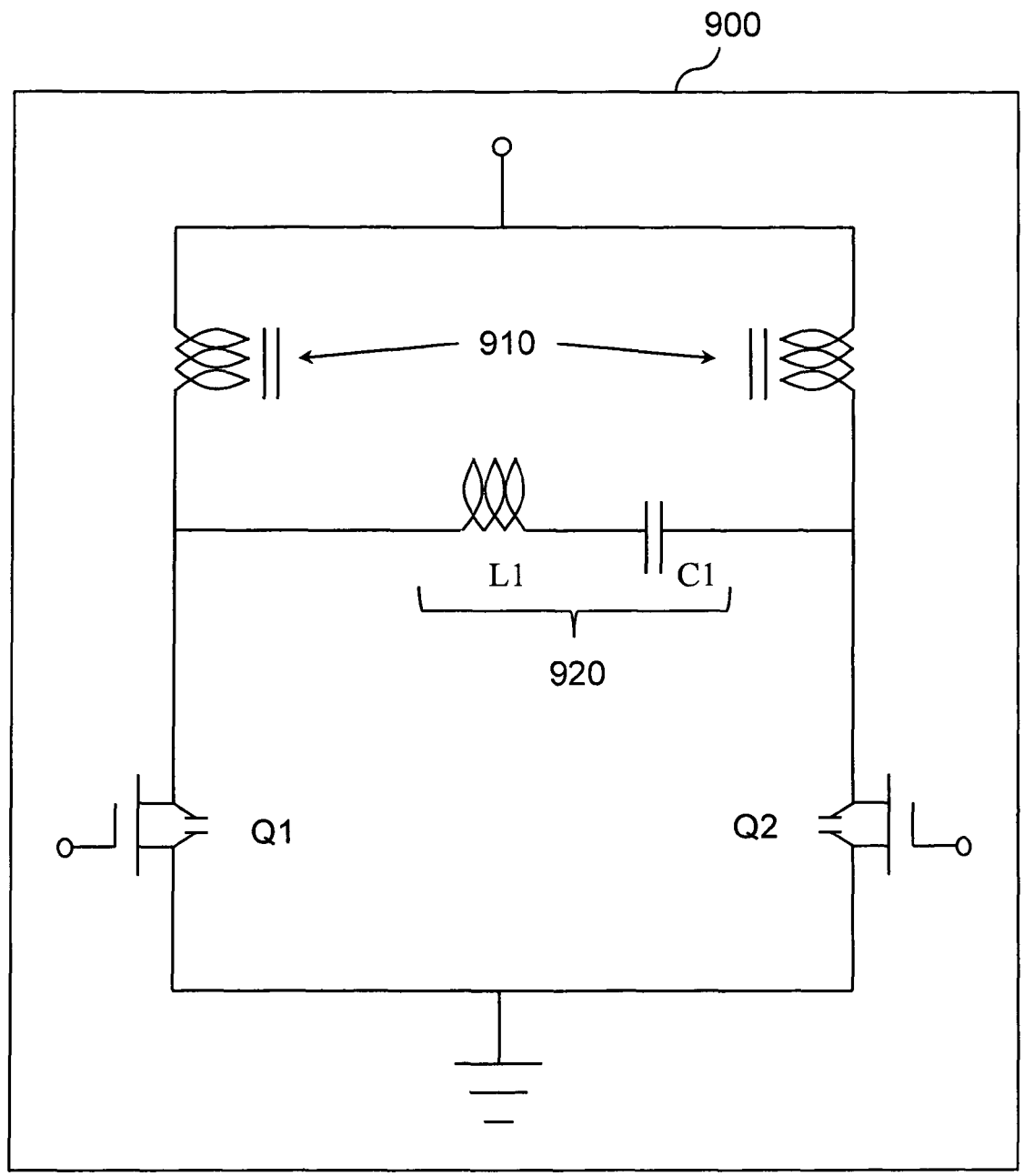
FIG. 9 illustrates one embodiment of an apparatus for use in parallel transmission in MRI.

FIG. 9 illustrates an apparatus 900 for use in parallel transmission in MRI. The apparatus 900 includes an on-coil amplifier with traces 910. The apparatus 900 includes a single L-C leg 920. The L-C leg 920 may be an inductor L1 in series with a capacitor C1. Thus, this apparatus 900 is capable of producing a single frequency in parallel transmission in MRI. The apparatus 900 includes two transistors Q1, Q2. The transistors Q1, Q2 may be connected as discussed above. The transistor gate voltages may be used to control the on-coil amplifier with the traces 910 and the L-C leg 920.

FIG. 9 is a more general illustration of the on-coil amplifier with an L-C leg described in connection with FIGS. 5-8. The apparatus 900 acts as a filter and a broadband output amplifier. The L-C leg 920 is a coil and a filter. If the apparatus 900 includes a single filter, then the apparatus 900 can be controlled to selectively excite a single frequency associated with the filter. When the L-C leg 920 is tuned to a certain frequency and if an off-frequency is driven into the circuit then the L-C leg 920 will reject it and no output signal will be produced. However, if the apparatus 900 had N filters, or a filter with N passbands, it could be controlled to selectively excite up to N frequencies. Typically, to excite multiple frequencies required separate coils that tended to interact with and interfere with each other. Adjusting one coil typically had an effect on another coil. This may have limited the incidence of multi-frequency applications. With the filters on the same on-coil amplifier, multi-frequency interference may be reduced or eliminated.

Figure 10:
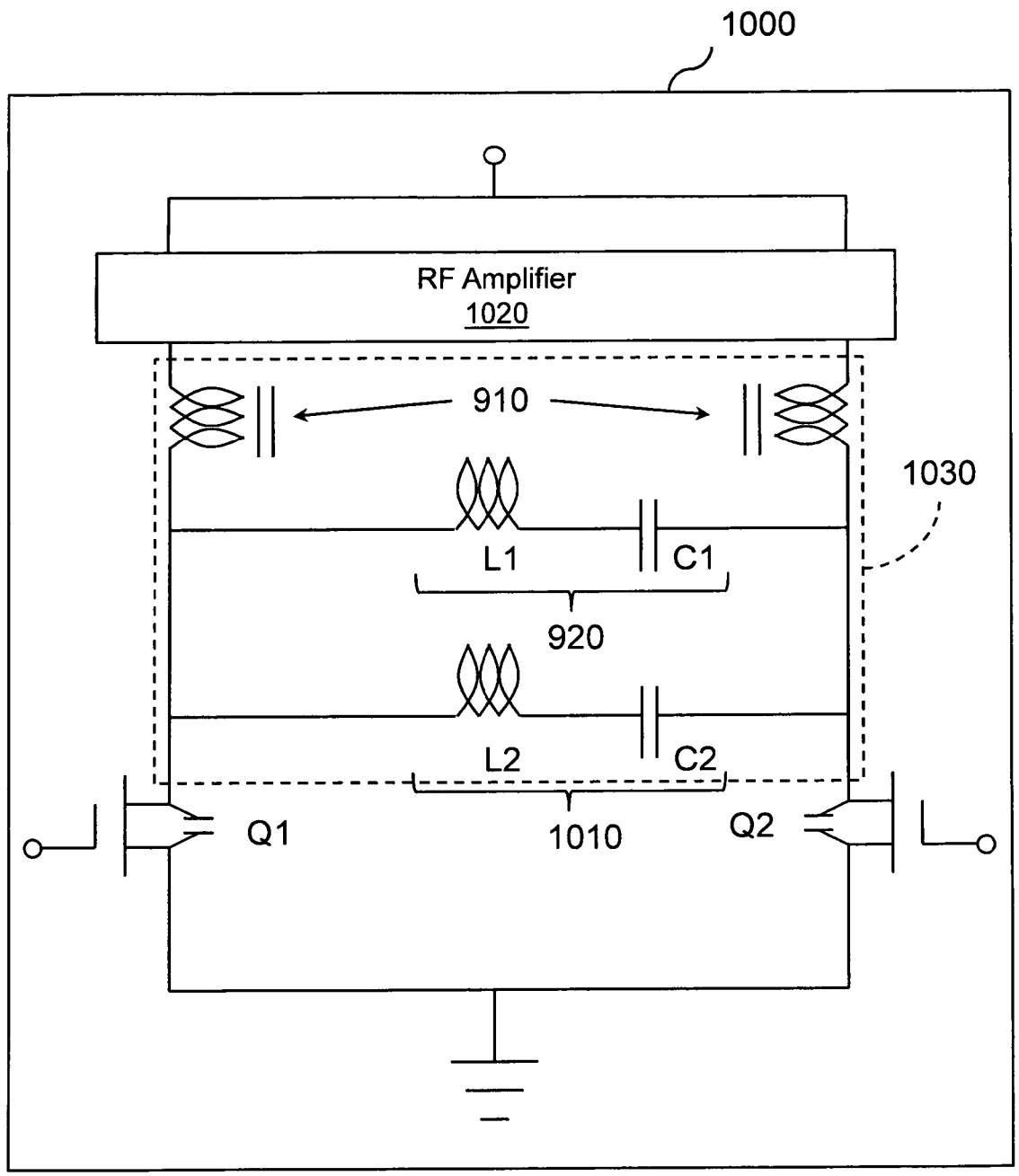
FIG. 10 illustrates one embodiment of an apparatus for use in multi-nuclear excitation in MRI.
Figure 11:
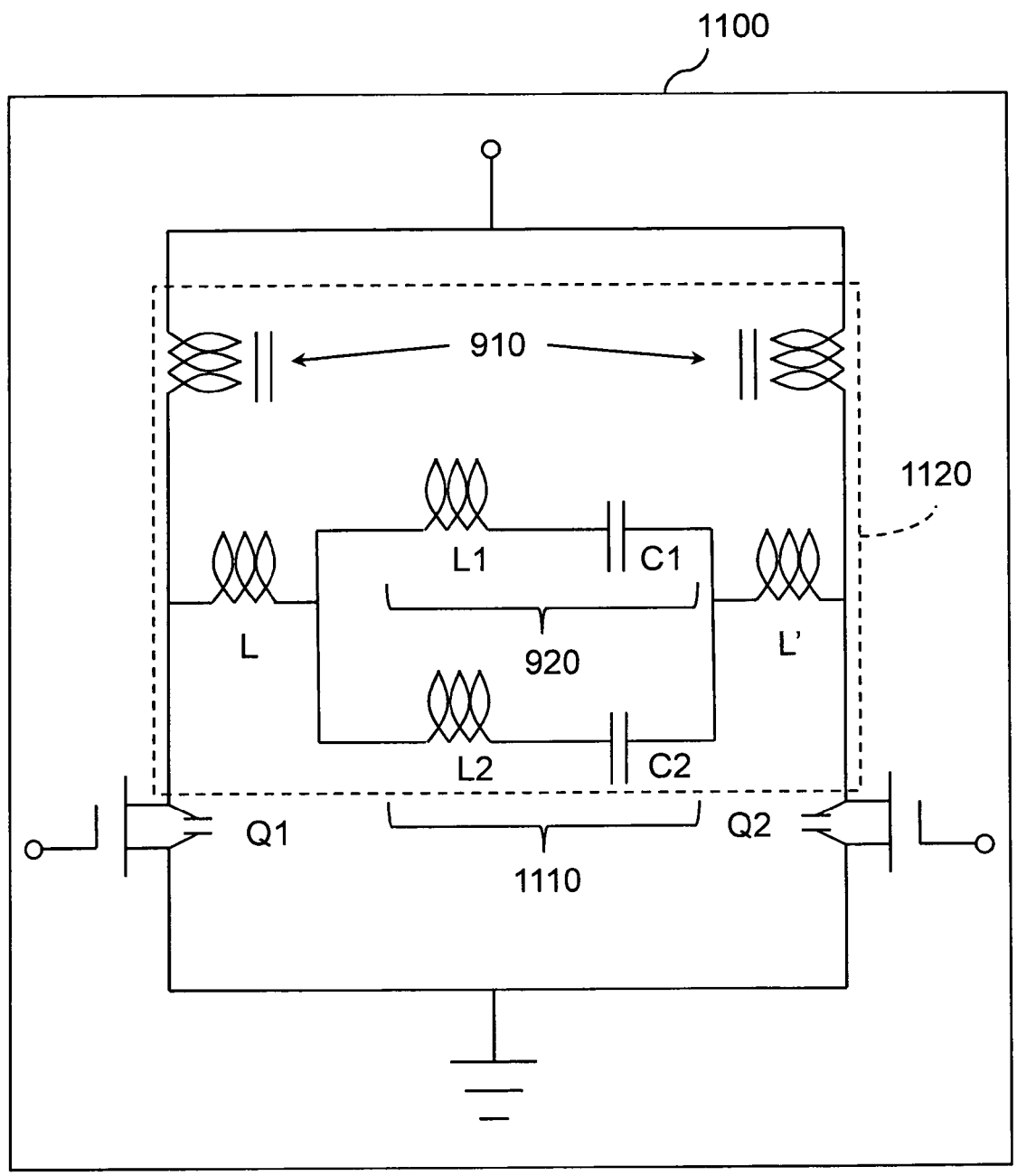
FIG. 11 illustrates one embodiment of another apparatus for use in multi-nuclear excitation in MRI.

FIG. 10 illustrates an apparatus 1000 for use in multi-nuclear excitation in MRI. The apparatus 1000 includes elements of the apparatus 900 for parallel transmission as illustrated in FIG. 9 (e.g., on-coil amplifier, L-C leg 920). Additionally, the apparatus 1000 includes a second L-C leg 1010. Thus, the apparatus 1000 includes multiple coils acting as filters electrically in parallel. In FIG. 11 the multiple coils are concentrically nested physically. The two L-C legs 920, 1010 are illustrated electrically in parallel and share amplifier elements. The two legs 920, 1010 offer separate excitation pathways, each of which may have a distinct frequency. While two legs 920, 1010 are illustrated, it is to be appreciated that the apparatus 1000 illustrated in FIG. 10 could include N legs, N being an integer greater than 1.

Thus, FIG. 10 illustrates an apparatus 1000 for use in multi-nuclear excitation in magnetic resonance imaging (MRI). The apparatus 1000 includes an RF amplifier 1020 placed near an RF 1030 coil that includes a set of at least two L-C coils. In one example, RF amplifier 1020 may be placed within one meter of RF coil 1030. In another example, RF amplifier 1020 may be placed within one centimeter of RF coil 1030. In another example, RF amplifier 1020 may be placed within one wavelength of RF coil 1030, where the wavelength is the wavelength of the RF waveform produced by apparatus 1000. In the other apparatus claimed herein, similar distances between amplifiers and coils may be employed. Members of the set of L-C coils have individual resonance frequencies. The RF amplifier 1020 can be controlled to cause the selective production of the frequency of a member of the set of L-C coils by a digital input. Members of the set of L-C coils may be arranged as nested coil loops, as stacked coil loops, and so on.

Members of the set of L-C coils may excite unpaired nucleons associated with various elements including, but not limited to, 3He, 13C, 17O, 19F, 23Na, and 31P. Additionally, at least one member of the set of L-C coils is to excite protons associated with 1H. Thus, members of the set of L-C coils excite protons and/or unpaired nucleons associated with elements naturally occurring and/or introduced into (e.g., injected, ingested) a body. The body may be, for example, a human body, an animal body, a plant body, and so on. To limit coupling between members of the set of L-C coils, the resonance frequencies of individual members of the set of L-C coils may be sparse or otherwise separated.

FIG. 11 illustrates an apparatus 1100 for use in multi-nuclear excitation in MRI. Like the apparatus 1000 in FIG. 10, the apparatus 1100 includes elements from the apparatus 900 of FIG. 9 (e.g., on-coil amplifier with traces 910, L-C leg 920). However, FIG. 11 illustrates a single coil 1120 with multiple discrete filters. Inductors L and L' represent coil traces while the L-C legs 920, 1110 represent discrete filters. Thus, the apparatus 1100 for use in multi-nuclear excitation can be realized with a single coil loop (L+L') with the discreet filters represented by the L-C legs 920, 1110 in the loop.

One embodiment may be an apparatus for use in multi-nuclear excitation in magnetic resonance imaging (MRI) that includes an RF coil having an RF amplifier placed near the RF coil and at least one filter to pass at least two frequencies. Once again, being placed "near" the RF coil may include being placed at distances less than one meter, less than one centimeter, and one wavelength of the RF waveform produced by the apparatus. In the embodiment, the RF amplifier may be controllable to selectively produce at least one of the at least two frequencies based, at least in part, on a digital input provided to the RF amplifier. In one example, the filter may be an L-C leg.

Figure 12:
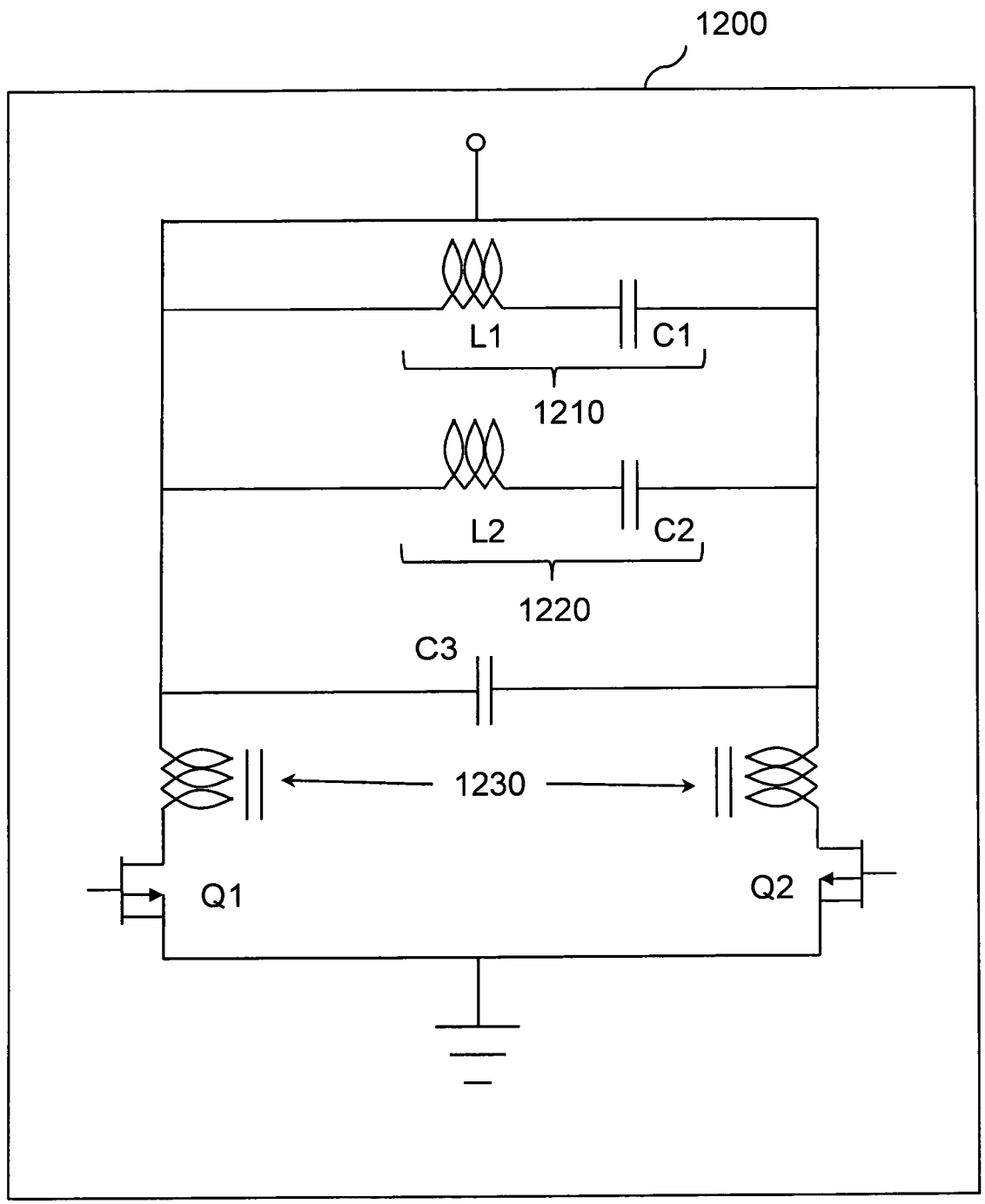
FIG. 12 illustrates one embodiment of another apparatus for use in multi-nuclear excitation in MRI.
Figure 13:
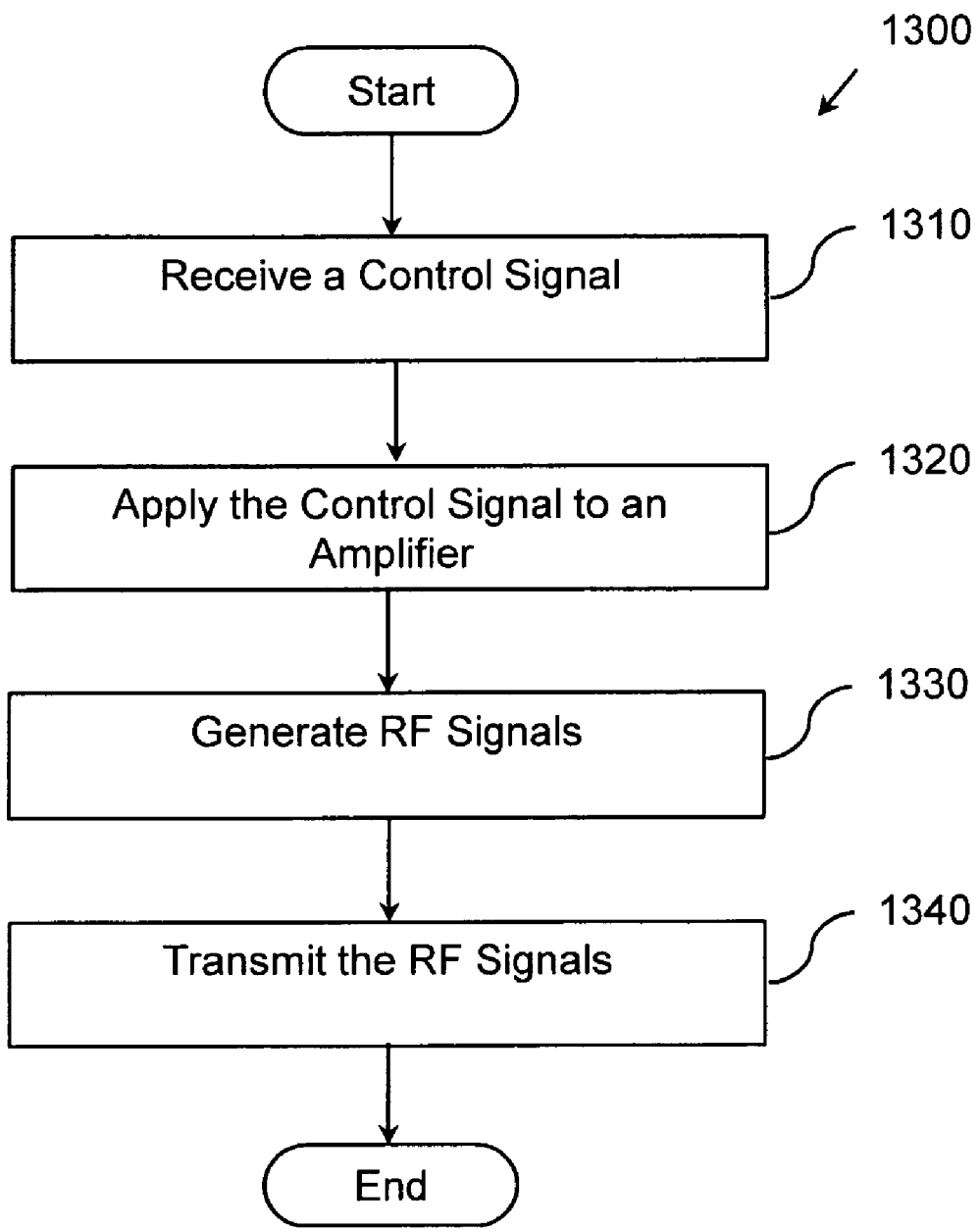
FIG. 13 illustrates one embodiment of a method for use in MRI.

FIG. 12 illustrates an apparatus 1200 for use in multi-nuclear excitation in MRI. The apparatus 1200 includes a first L-C leg 1210 and a second L-C leg 1220. The first L-C leg 1120 is formed by inductor L1 and capacitor C1. The second L-C leg 1220 is formed by inductor L2 and capacitor C2. The apparatus 1200 includes a capacitor C3 in parallel with the first L-C leg 1210 and the second L-C leg 1220. A coil is formed by a pair of coil segments 1230. The coil is controlled by as discussed above by a pair of FET transistors Q1, Q2.

In one embodiment the apparatus 1200 may support and filter five frequencies. A digital controller may control the first L-C leg 1210, the second L-C leg 1220, and the capacitor C3. The digital controller may control these elements by switching and/or connecting them to the coil segments 1230. For example a first frequency may be supported when just the first L-C leg 1210 is connected to the coil segments 1230. If the inductor and capacitor values of the first L-C leg 1210 and the second L-C leg 1220 are the same, then the first frequency may be supported by alternatively connecting the second L-C leg 1220 to the coil segments 1230. A second frequency may be supported by connecting the capacitor C3 to the coil segments 1230. A third frequency may be supported by connecting the first L-C leg 1210, the second L-C leg 1220, and the capacitor C3 to the coil segments 1230. A fourth frequency may be supported by connecting the first L-C leg 1210 and the capacitor C3 to the coil segments 1230. A fifth frequency may be supported by connecting the first L-C leg 1210 and the second L-C leg 1220 to the coil segments 1230.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

The apparatuses illustrated in FIGS. 10 and 11 may be employed in a method 1300 for MRI. The method 1300 may include receiving, at 1310, a low power digital control signal for multi-nuclear excitation in MRI. The method 1300 includes, at 1320, applying the low power digital signal to an on-coil current-mode amplifier. The signal controls a set of L-C coils to generate a set of L-C frequencies. A set of amplified analog RF signals having different frequencies is generated at 1330. The different frequencies are determined, at least in part, by the low power digital control signal and the set of L-C frequencies. The method 1300, at 1340, transmits the set of amplified analog RF signals. The set of amplified analog RF signal may be transmitted through a body during a medical evaluation procedure.

In one embodiment, the method 1300 may include applying the set of amplified analog RF signals to excite unpaired nucleons associated with one or more of, 3He, 13C, 17O, 19F, 23Na, and 31P. The method 1300 may also include applying the set of amplified analog RF signals to excite protons associated with 1H. The set of amplified analog RF signals may also be applied to excite unpaired nucleons associated with elements naturally occurring in a body. The body is one of a human body, an animal body, and a plant body.

It will be appreciated that in one embodiment, the methods herein may be implemented as computer executable instructions embodied and stored on a computer-readable medium. When executed by a machine (e.g., processor, device) the instructions cause the machine to perform the methods herein and their equivalents. The methods can also be implemented with circuits.

Figure 14:
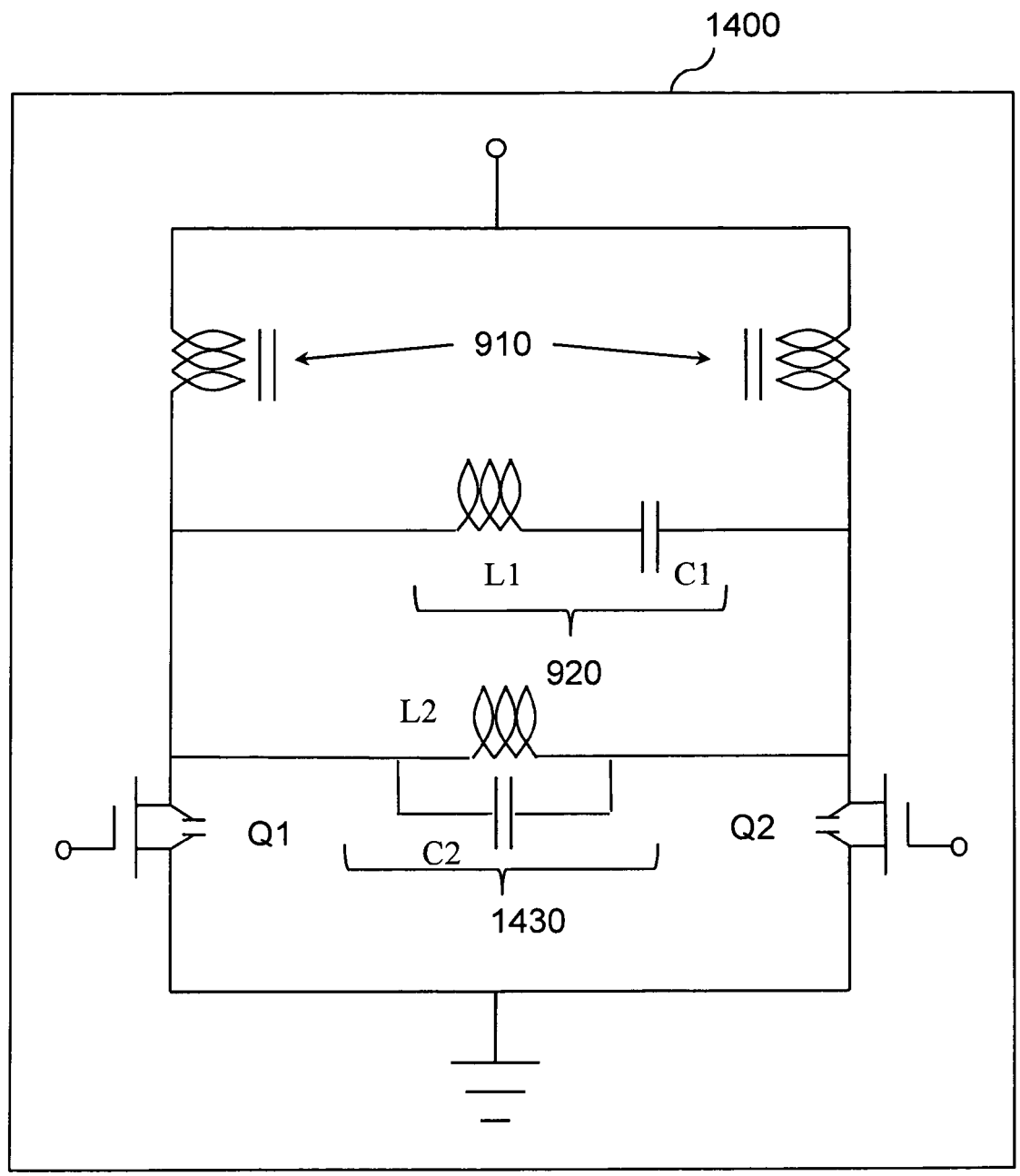
FIG. 14 illustrates one embodiment of an apparatus for use in multi-nuclear excitation in MRI.

FIG. 14 illustrates an apparatus 1400 for use in single nuclear excitation in MRI. The apparatus 1400 includes elements of the apparatus 900 for parallel transmission as illustrated in FIG. 9 (e.g., on-coil amplifier, L-C leg 920). Additionally, the apparatus 1400 includes an additional, parallel LC output filter 1430.

Figure 15:
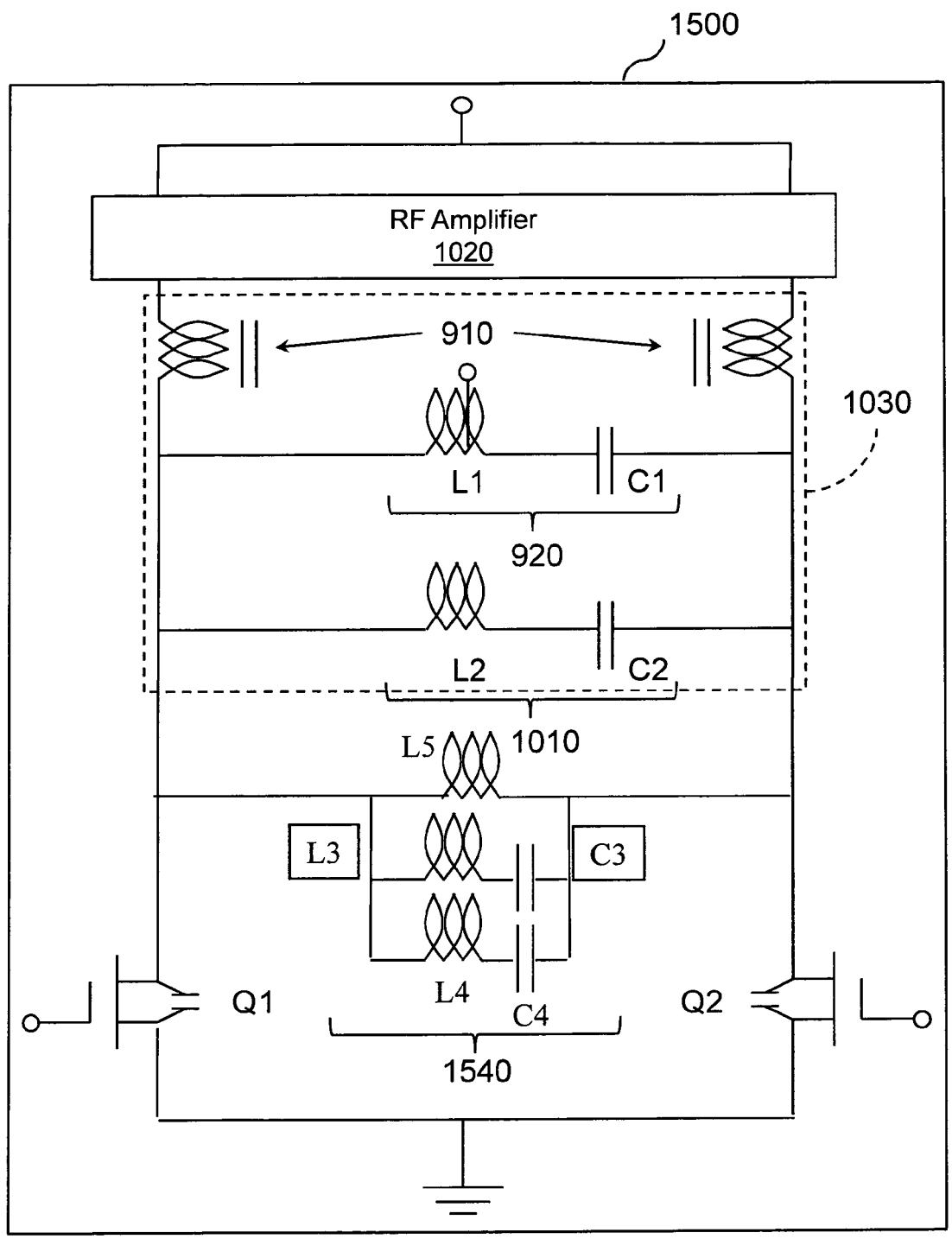
FIG. 15 illustrates one embodiment of an apparatus for use in multi-nuclear excitation in MRI.

FIG. 15 illustrates an apparatus 1500 for use in multi-nuclear excitation in MRI. Like the apparatus 1000 in FIG. 10, the apparatus 1500 includes elements from the apparatus 900 of FIG. 9 (e.g., on-coil amplifier with traces 910, L-C leg 920). However, FIG. 15 illustrates an additional, parallel LC output filter 1540. It is to be appreciated that in apparatus 1400 and apparatus 1500, that the amplifier(s) may be located from the coil(s) at distances less than one meter, less than one centimeter, and one wavelength of the RF waveform produced by the apparatus 1400 and the apparatus 1500.

To the extent that the term "or" is employed in the detailed description or claims (e.g., A or B) it is intended to mean "A or B or both". The term "and/or" is used in the same manner, meaning "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

What is claimed is:

1. An MRI compatible apparatus, comprising:
a radio frequency (RF) coil comprising a set of two or more individual L-C coils, where members of the set of two or more individual L-C coils have individual resonance frequencies; and
an RF amplifier located and positioned within one meter of the RF coil; and
where the RF amplifier is controllable to provide different signals to different members of the set of two or more individual L-C coils in order to control the members of the set of two or more individual L-C coils to individually selectively produce the individual resonance frequencies of the respective members of the set of two or more individual L-C coils based, at least in part, on a digital input provided to the RF amplifier.

2. The MRI compatible apparatus of claim 1, where members of the set of two or more individual L-C coils are arranged as one or more of, nested coil loops, and stacked coil loops.

3. The MRI compatible apparatus of claim 1, the RF amplifier being a current mode class D amplifier located on the RF coil.

4. The MRI compatible apparatus of claim 1, the RF amplifier being positioned and located less than 1 centimeter from the RF coil.

5. The MRI compatible apparatus of claim 1, the RF amplifier being positioned and located less than one wavelength of an RF waveform from the RF coil, where the wavelength is the individual resonance frequency produced by the RF coil.

6. The MRI compatible apparatus of claim 1, where members of the set of two or more individual L-C coils excite unpaired nucleons associated with one or more of, 3He, 13C, 17O, 19F, 23Na, 31P, and elements naturally occurring in a body.

7. The MRI compatible apparatus of claim 6, where at least one member of the set of two or more individual L-C coils excites protons associated with 1H.

8. The MRI compatible apparatus of claim 6, where the body is one of a human body, an animal body, and a plant body.

9. The MRI compatible apparatus of claim 1, where members of the set of two or more individual L-C coils excite unpaired nucleons associated with elements introduced into in a body.

10. The MRI compatible apparatus of claim 1, where the individual resonance frequencies of the set of two or more individual L-C coils limit coupling between members of the set of two or more individual L-C coils.

11. The MRI compatible apparatus of claim 1, where the individual resonance frequencies of the set of two or more individual L-C coils are separated by a pre-determined amount to limit coupling between members of the set of two or more individual L-C coils.

12. The MRI compatible apparatus of claim 1, where the apparatus is configured in order to provide frequency correction in MRI.

13. An MRI compatible method, comprising:
receiving a low power digital control signal;
applying the low power digital control signal to an on-coil current-mode amplifier,
where the on-coil current-mode amplifier is controlled to provide an L-C control signal to a set of individual L-C coils to control the set of individual L-C coils to generate a set of individual L-C frequencies, the on-coil current-mode amplifier being located and positioned less than one meter from the set of individual L-C coils, where the set of individual L-C coils is a part of an RF coil;

generating a set of amplified analog RF signals having different frequencies, where the different frequencies are determined, at least in part, by the low power digital control signal, the L-C control signal, and the set of individual L-C frequencies; and transmitting the generated set of amplified analog RF Signals.

14. The MRI compatible method of claim 13, comprising exciting unpaired nucleons associated with one or more of, 3He, 13C, 17O, 19F, 23Na, and 31P by applying the set of amplified analog RF signals.

15. The MRI compatible method of claim 13, comprising applying the set of amplified analog RF signals to excite protons associated with 1H.

16. The MRI compatible method of claim 14, comprising applying the set of amplified analog RF signals to excite the unpaired nucleons associated with elements naturally occurring in a body.

17. The MRI compatible method of claim 16, where the body is one of a human body, an animal body, and a plant body.

18. An MRI compatible apparatus configured for use in multi-nuclear excitation of unpaired nucleons in magnetic resonance imaging (MRI), comprising:

an RF coil, where an RF amplifier is located and positioned within one meter of the RF coil, where the RF amplifier is controllable to provide a simultaneous signal to two or more individual filters of a set of two or more individual filters, where the simultaneous signal is configured to control the set of two or more individual filters to individually selectively produce at least one of the at least two frequencies based, at least in part, on a digital input provided to the RF amplifier, where the set of two or more individual filters are configured to pass at least two frequencies; and at least two field effect transistors (FETs) connected to the RF coil.

19. The MRI compatible apparatus of claim 18, at least one filter of the set of two or more individual filters being an L-C leg, and where the RF amplifier is a current-mode amplifier.

20. The MRI compatible apparatus of claim 18, where the RF amplifier is located and positioned within ten centimeters of the RF coil.

21. The MRI compatible apparatus of claim 18, where the RF amplifier is located and positioned within one wavelength of the RF coil, the wavelength being the wavelength produced by the apparatus.

22. The MRI compatible apparatus of claim 18, where the set of two or more individual filters are coupled to the RF coil with at least one transistor, and where at least one filter of the set of two or more individual filters is controlled by the gate voltage of at least one transistor.

23. The MRI compatible apparatus of claim 18, where the RF amplifier is configured to digitally select one or more of the set of two or more individual filters in order to produce at least two frequencies.

24. The MRI compatible apparatus of claim 18, where the at least two FETs may be driven out of phase in order to optimize efficiency.

25. The MRI compatible apparatus of claim 24, where the apparatus produces pulsed power outputs up to 1200 W.

26. The MRI compatible apparatus of claim 18, where the pulsed power outputs are produced with amplifier efficiencies in the 85% range.

27. The MRI compatible apparatus of claim 18, where the apparatus achieves upper harmonic suppression of greater than 40 dB.

28. The MRI compatible apparatus of claim 18, where the apparatus creates isolation of 20 dB due to coil detuning in the off state.

29. The MRI compatible apparatus of claim 18, where the apparatus includes adjacent not overlapping resonant coils, where there is 6 dB of isolation between the adjacent not overlapping resonant coils.

30. The MRI compatible apparatus of claim 18, where concentric shielding reduces electric field coupling in the RF coil.

31. The MRI compatible apparatus of claim 18, where the apparatus includes voltage sources and current sources that are individually digitally controllable.

32. The MRI compatible apparatus of claim 18, where the RF coil includes a first coil and a second coil, where the first and second coil are physically concentrically nested, and where the first coil is distinct from the second coil.

* * * * *